(12) United States Patent
Strock et al.

(10) Patent No.: US 11,352,890 B2
(45) Date of Patent: Jun. 7, 2022

(54) HYBRID THERMAL BARRIER COATING

(71) Applicant: United Technologies Corporation, Farmington, CT (US)

(72) Inventors: Christopher W. Strock, Kennebunk, ME (US); Kevin W. Schlichting, South Glastonbury, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 246 days.

(21) Appl. No.: 15/620,075

(22) Filed: Jun. 12, 2017

(65) Prior Publication Data
US 2018/0355734 A1 Dec. 13, 2018

(51) Int. Cl.
F01D 5/28 (2006.01)
F01D 9/02 (2006.01)
(Continued)

(52) U.S. Cl.
CPC .............. F01D 5/288 (2013.01); C23C 4/01 (2016.01); C23C 4/02 (2013.01); C23C 4/073 (2016.01); C23C 4/11 (2016.01); C23C 4/123 (2016.01); C23C 4/134 (2016.01); C23C 4/137 (2016.01); C23C 4/18 (2013.01); C23C 14/024 (2013.01); C23C 14/042 (2013.01); C23C 14/083 (2013.01); C23C 14/30 (2013.01); C23C 28/042 (2013.01); C23C 28/3215 (2013.01); F01D 9/02 (2013.01); F01D 11/08 (2013.01); F23R 3/002 (2013.01); F23R 3/28 (2013.01); C23C 4/129 (2016.01); F05D 2220/30 (2013.01); F05D 2230/312 (2013.01); F05D 2230/313 (2013.01); F05D 2230/90 (2013.01); F05D 2250/182 (2013.01); F05D 2250/294 (2013.01); F05D 2300/17 (2013.01); F05D 2300/2118 (2013.01); F05D 2300/5023 (2013.01); F05D 2300/50212 (2013.01)

(58) Field of Classification Search
None
See application file for complete search history.

(56) References Cited

U.S. PATENT DOCUMENTS 5,064,727 A * 11/1991 Naik .................. C23C 30/00
415/173.4
6,251,526 B1 6/2001 Staub
(Continued)

FOREIGN PATENT DOCUMENTS

EP 2108715 A2 10/2009
EP 2468925 A2 6/2012
(Continued)

OTHER PUBLICATIONS

Julia Layton, Turbine Aerodynamics, Aug. 7, 2010, HowStuffWorks (Year: 2010).*
(Continued)

Primary Examiner — Mary I Omori
(74) Attorney, Agent, or Firm — Bachman & LaPointe, P.C.

(57) ABSTRACT

An article has a metallic substrate having a plurality of recesses. A first coating is at least at the recesses and has: a splatted layer; and a columnar layer atop the splatted layer. A second coating is away from the recesses and has: a columnar layer atop the substrate without an intervening splatted layer.

21 Claims, 3 Drawing Sheets

(51) Int. Cl.
*F23R 3/00* (2006.01)
*F23R 3/28* (2006.01)
*F01D 11/08* (2006.01)
*C23C 4/073* (2016.01)
*C23C 4/134* (2016.01)
*C23C 4/18* (2006.01)
*C23C 4/123* (2016.01)
*C23C 14/08* (2006.01)
*C23C 14/30* (2006.01)
*C23C 4/11* (2016.01)
*C23C 4/02* (2006.01)
*C23C 14/02* (2006.01)
*C23C 4/137* (2016.01)
*C23C 14/04* (2006.01)
*C23C 28/04* (2006.01)
*C23C 4/01* (2016.01)
*C23C 28/00* (2006.01)
*C23C 4/129* (2016.01)

(56) References Cited

U.S. PATENT DOCUMENTS

| | | |
|---|---|---|
| 6,316,078 B1 | 11/2001 | Smialek |
| 6,503,574 B1 | 1/2003 | Skelly et al. |
| 7,875,370 B2 | 1/2011 | Schlichting et al. |
| 8,007,899 B2 | 8/2011 | Freling et al. |
| 8,216,687 B2 | 7/2012 | Burd et al. |
| 8,535,783 B2 | 9/2013 | Lutjen et al. |
| 2002/0110698 A1* | 8/2002 | Singh .................... C23C 14/083 428/472 |
| 2003/0152814 A1 | 8/2003 | Gupta et al. |
| 2006/0239819 A1* | 10/2006 | Albert .................... F01D 5/187 416/97 R |
| 2011/0097538 A1* | 4/2011 | Bolcavage ............. F01D 5/288 428/137 |
| 2011/0116920 A1* | 5/2011 | Strock .................... C23C 28/00 415/229 |
| 2012/0231211 A1 | 9/2012 | von Niessen et al. |
| 2013/0122259 A1 | 5/2013 | Lee |
| 2015/0300180 A1* | 10/2015 | Candelori ............... F01D 5/288 415/116 |
| 2016/0251970 A1 | 9/2016 | Strock et al. |
| 2018/0135441 A1* | 5/2018 | Hudson ................ F04D 29/324 |

FOREIGN PATENT DOCUMENTS

| | | |
|---|---|---|
| EP | 3037570 A1 | 6/2016 |
| GB | 2061397 A | 5/1981 |
| WO | 2011/085376 A1 | 7/2011 |

OTHER PUBLICATIONS

European Search Report dated Oct. 22, 2018 for European Patent Application No. 18166836.9.

* cited by examiner

HYBRID THERMAL BARRIER COATING

U.S. GOVERNMENT RIGHTS

This invention was made with Government support under contract FA8650-15-D-2502-0002 awarded by the United States Air Force. The Government has certain rights in this invention.

BACKGROUND

The disclosure relates to gas turbine engines. More particularly, the disclosure relates to thermal barrier coatings for gas turbine engines.

Gas turbine engine gaspath components are exposed to extreme heat and thermal gradients during various phases of engine operation. Thermal-mechanical stresses and resulting fatigue contribute to component failure. Significant efforts are made to cool such components and provide thermal barrier coatings to improve durability.

Exemplary thermal barrier coating systems include two-layer thermal barrier coating systems. An exemplary system includes NiCoCrAlY bondcoat (e.g., air plasma sprayed (APS), low pressure plasma sprayed (LPPS), or cathodic arc deposited) and yttria-stabilized zirconia (YSZ) (or gadolinia-stabilized zirconia (GSZ)) thermal barrier coating (TBC) (e.g., air plasma sprayed (APS) or electron beam physical vapor deposited (EB-PVD)). Prior to and while the barrier coat layer is being deposited, a thermally grown oxide (TGO) layer (e.g., alumina) forms atop the bondcoat layer. As time-at-temperature and the number of cycles increase, this TGO interface layer grows in thickness. An exemplary YSZ is 7 weight percent yttria-stabilized zirconia (7YSZ).

Exemplary TBCs are applied to thicknesses of 1-40 mils (0.025-1.0 mm) and can contribute to a temperature reduction of up to 300° F. (167° C.) at the base metal. This temperature reduction translates into improved part durability, higher turbine operating temperatures, and improved turbine efficiency.

U.S. Pat. No. 8,535,783 of Lutjen et al., Sep. 17, 2013, the disclosure of which is incorporated by reference herein in its entirety as if set forth at length, discloses formation of a segmented thermal barrier coating by creating recesses in the substrate and allowing crack propagation from deformed rims of the recesses.

SUMMARY

One aspect of the disclosure involves an article comprising: a metallic substrate having a plurality of recesses. A first coating is at least at the recesses and comprises: a splatted layer; and a columnar layer atop the splatted layer. A second coating is away from the recesses and comprises: a columnar layer atop the substrate without an intervening splatted layer.

A further embodiment may additionally and/or alternatively include the second coating being between the recesses.

A further embodiment may additionally and/or alternatively include: the recesses being along a first region; a second region lacking the recesses; and the second coating being along the second region.

Another aspect of the disclosure involves an article comprising: a metallic substrate having a surface with a first region and a second region. A plurality of recesses are in the first region. A first coating system is at least at the recesses in the first region and comprises a splatted layer and a columnar layer atop the splatted layer. A second coating system is along the second region and comprises a columnar layer atop the substrate without an intervening splatted layer.

A further embodiment may additionally and/or alternatively include: the first coating system columnar layer being a columnar crystalline layer; and the second coating system columnar layer being a columnar crystalline layer.

A further embodiment may additionally and/or alternatively include the substrate forming an airfoil having a leading edge, a trailing edge, a pressure side and a suction side and the second region being along the leading edge.

A further embodiment may additionally and/or alternatively include the substrate forming an airfoil having a leading edge, a trailing edge, a pressure side and a suction side. The first region is along a majority of the pressure side and the second region is along a majority of the suction side.

A further embodiment may additionally and/or alternatively include the recesses being separated by walls. Segmentation cracks extend from the walls through the first coating system columnar layer and/or the second coating system columnar layer.

A further embodiment may additionally and/or alternatively include the recesses being separated by walls. The second coating system extends along the walls. Segmentation cracks extend from the walls through the first coating system columnar layer and/or the second coating system columnar layer.

A further embodiment may additionally and/or alternatively include a first bondcoat being along respective bases of the recesses and a second bondcoat being along the second region.

A further embodiment may additionally and/or alternatively include the first bondcoat being an MCrAlY and the second bondcoat being an MCrAlY.

A further embodiment may additionally and/or alternatively include at least one of: the metallic substrate is a nickel-based superalloy casting; the first coating system splatted layer has a thickness of at least 250 micrometers; the first coating system columnar layer has a thickness of at least 25 micrometers; and the second coating system columnar layer has a thickness of at least 25 micrometers.

A further embodiment may additionally and/or alternatively include at least one of: the metallic substrate is a nickel-based superalloy casting; the first coating system splatted layer has a majority by weight of GSZ over a thickness of at least 250 micrometers; the first coating system columnar layer has a majority by weight of YSZ over a thickness of at least 25 micrometers; and the second coating system columnar layer has a majority by weight of YSZ over a thickness of at least 25 micrometers.

A further embodiment may additionally and/or alternatively include the first coating system columnar layer and the second coating system columnar layer being the same material.

A further embodiment may additionally and/or alternatively include the first coating system columnar layer and the second coating system columnar layer being GSZ and the first coating system splatted layer being a YSZ.

A further embodiment may additionally and/or alternatively include the article of having an airfoil, the airfoil having a leading edge, a trailing edge, a pressure side, and a suction side wherein: the recesses represent at least 1% of a lateral surface area of the airfoil; the first coating is at least along 1% of the lateral surface area; the second coating is at least along 1% of the lateral surface.

A further embodiment may additionally and/or alternatively include a turbomachine including the article of as an airfoil member.

A further embodiment may additionally and/or alternatively include the turbomachine of being a gas turbine engine.

A further embodiment may additionally and/or alternatively include a method for manufacturing the article. The method comprises: applying the first coating system splatted layer by air plasma spray; and applying the first coating system columnar layer and the second coating system columnar layer via electron beam physical vapor deposition or suspension plasma spray.

A further embodiment may additionally and/or alternatively include: applying a first bondcoat to at least the recesses via high velocity oxy-fuel spray; and applying a second bondcoat to at least the second region via vapor deposition, plasma-spray, or cathodic arc deposition.

A further embodiment may additionally and/or alternatively include the applying the second bondcoat comprising electron beam physical vapor deposition.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
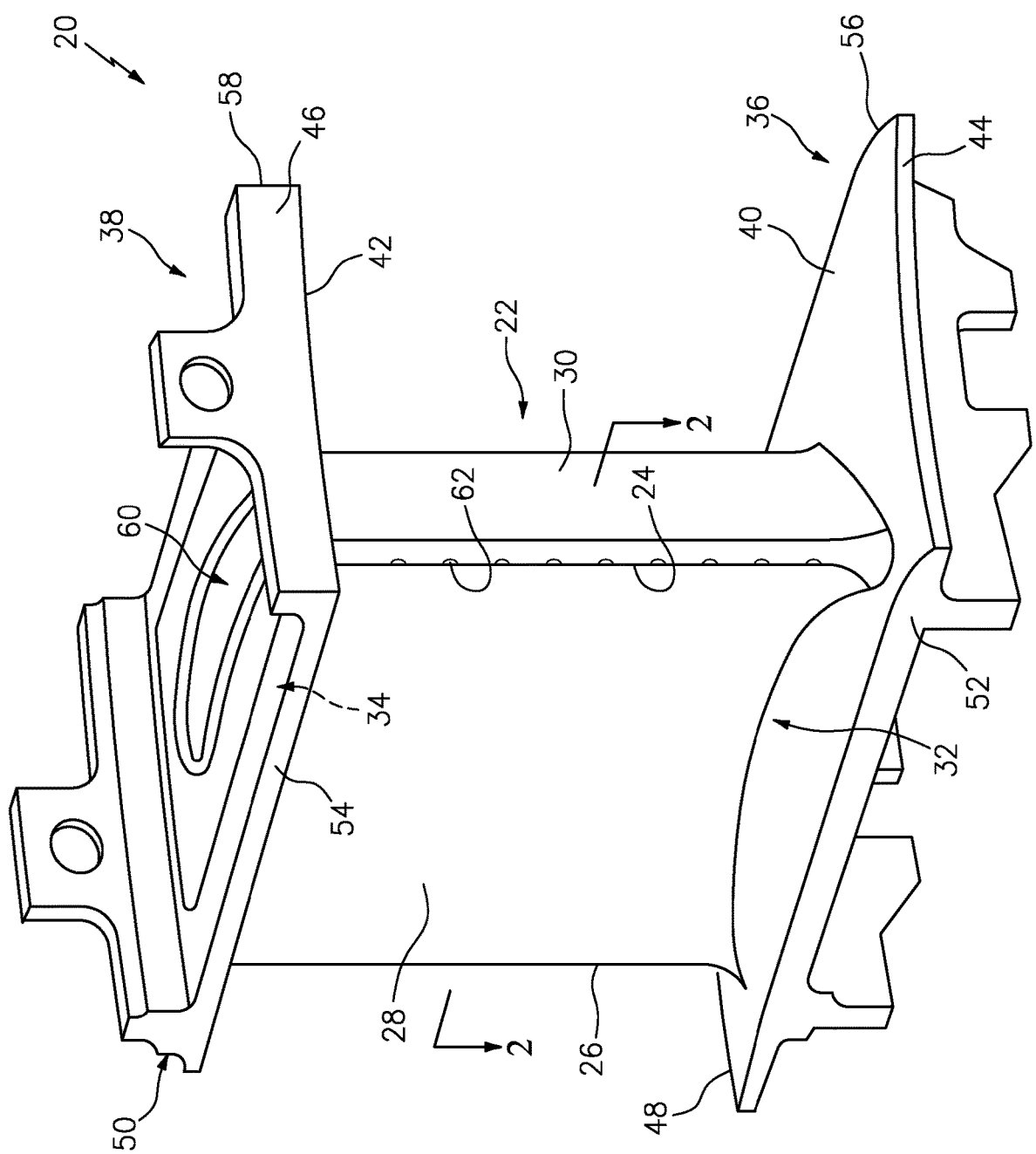
FIG. 1 is a view of a gas turbine engine turbine vane.

FIG. 1 shows a coated metallic article 20 as a vane such as used in a gas turbine engine (broadly inclusive of turbojets, turboshafts, turbofans, industrial gas turbines (IGT), and the like). The exemplary vane 20 is a singlet having a single airfoil 22. Alternative vanes may be clusters. Alternative articles may include blades, fuel nozzle guides, combustor panels, blade outer air seals (BOAS), and the like.

As is discussed further below, the airfoil has a leading edge 24 and a trailing edge 26. A pressure side 28 and a suction side 30 extend streamwise between the leading edge and the trailing edge (see also, FIG. 2). Spanwise, the airfoil extends radially outward (in the context of the engine in which it is to be installed) from an inboard end 32 to an outboard end 34.

With the exemplary vane, the inboard end is at an inner diameter (ID) platform or shroud 36 and the outboard end is at an outer diameter (OD) platform or shroud 38. The ID platform and OD shroud have respective gaspath-facing surfaces 40 and (an OD surface of the ID platform and an ID surface of the OD shroud). Alternative, so-called "cantilever" vanes have no ID platform. Rather, their airfoils have ID tips.

Each of the ID platform 36 and OD shroud 38 extend from a respective forward/upstream end 44, 46 to a respective aft/downstream end 48, 50 and have respective first circumferential ends 52, 54 and second circumferential ends 56, 58.

The circumferential ends may bear slots (not shown) for mounting seals so that the first adjacent circumferential end of one platform or shroud seals to the second adjacent circumferential end of the next. Additionally, the platforms may have mounting features and other structures.

Furthermore, the exemplary vane is a cooled vane having a cooling passageway system with one or more inlets and one or more outlets. An exemplary inlet 60 is shown along the outboard surface of the OD shroud 38. Outlets (for discharging cooling air) may include leading edge holes 62 and trailing edge holes 64 (e.g., the latter forming a trailing edge discharge slot). Additional holes 66 may be located along the pressure and/or suction sides. The various holes may extend from one or more spanwise cavities. In the exemplary embodiment, this includes a leading edge impingement cavity 70, a first intermediate cavity 72, a second intermediate cavity 74, and a trailing edge cavity 76 from which the discharge slot extends.

Figure 2:
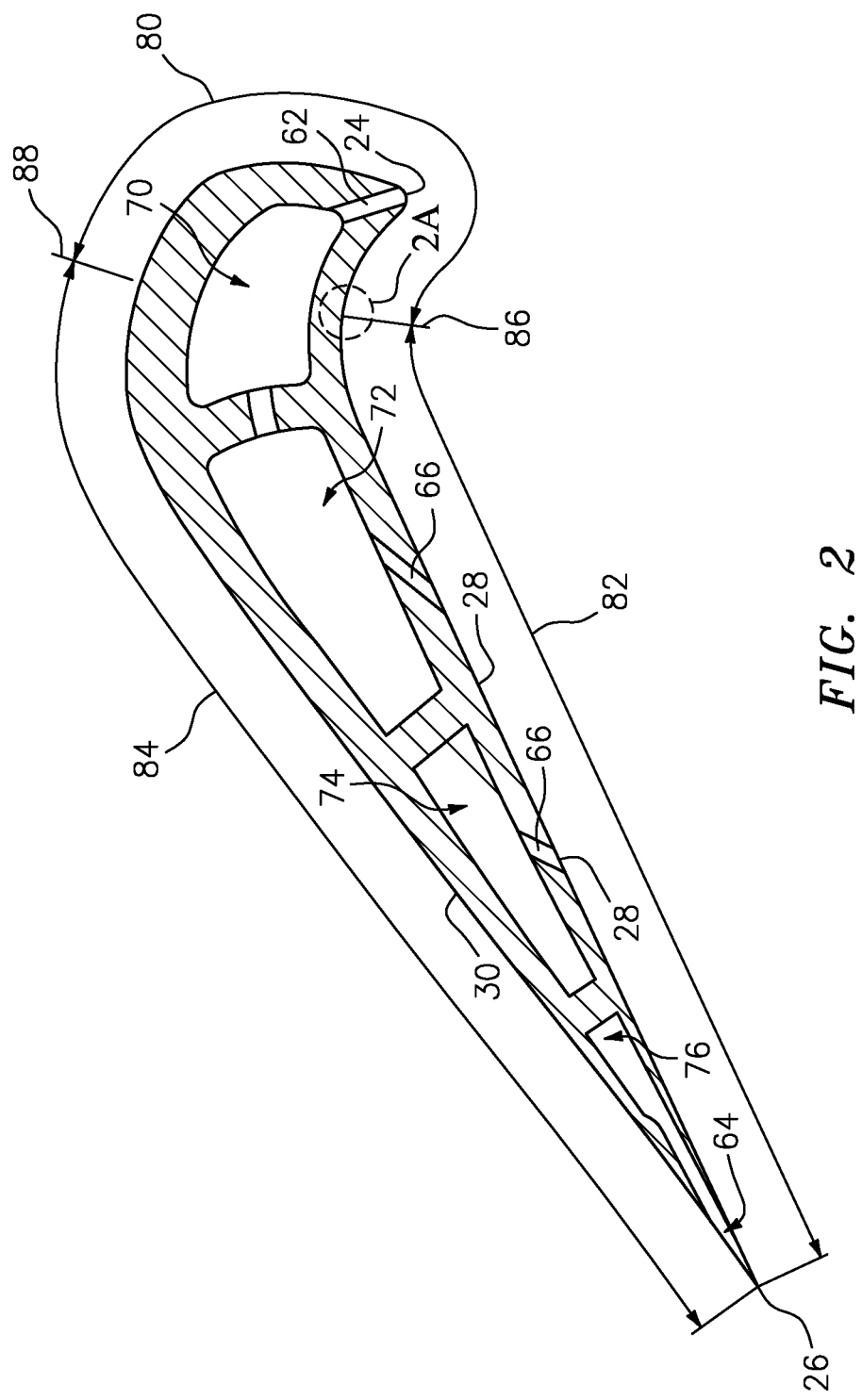
FIG. 2 is a sectional view of an airfoil of the gas turbine engine turbine vane, taken along line 2-2 of FIG. 1.

FIG. 2 shows three zones 80, 82, and 84 along the surface of the airfoil. As is discussed further, the nature of the particular coating may differ between these zones. The first zone 80 is a leading edge zone. This zone is subject to high erosion. A remaining pressure side zone 82 downstream of a junction 86 is subject to high thermal loads. A corresponding suction side zone 84 downstream of a junction 88 is subject to lesser thermal loads.

Figure 2A:
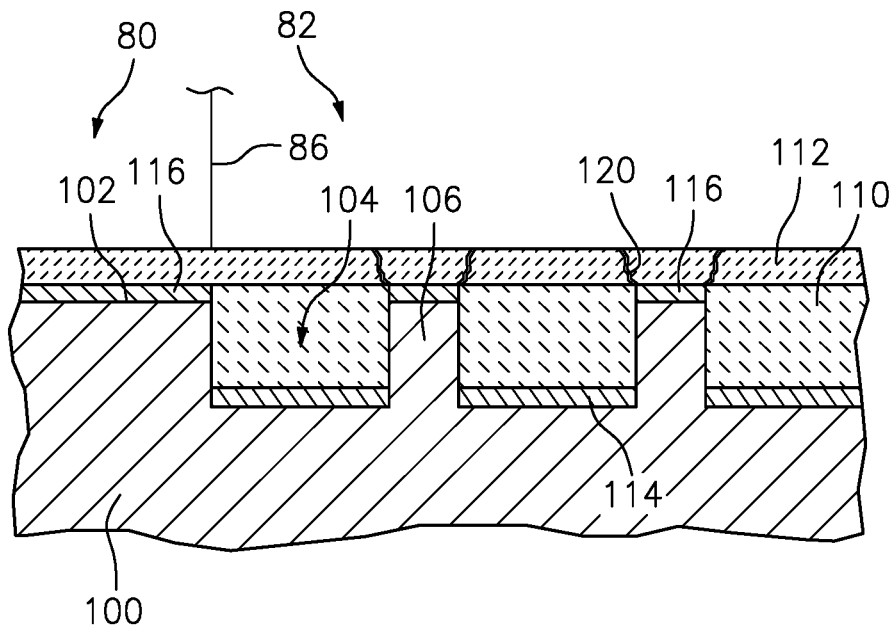
FIG. 2A is an enlarged view of a coating on the airfoil of FIG. 2.

FIG. 2A shows the metallic substrate 100 of the vane. The vane has a principal exterior surface 102 below which a plurality of blind recesses 104 extend. The recesses may be in a hexagonal close packed or similar array leaving intact substrate portions 106 therebetween. The recesses 104 define a recessed zone or region. Recess diameters, depths, spacing may be the same as disclosed in U.S. Pat. No. 8,535,783. Also, manufacture techniques may be similar and may optionally include the edge/rim features disclosed therein.

In the exemplary implementation, the leading edge zone 80 is an unrecessed zone and the pressure side zone 82 is a recessed zone having the recesses 104 and the intact portions 106 therebetween. In the exemplary embodiment, a first ceramic coating layer 110 is at least within the recesses. The coating 110 is applied via a spray technique (e.g., air plasma spray (APS)) which forms a splatted microstructure. Atop the coating layer 110 is a second ceramic coating layer 112 deposited via vapor deposition (e.g., electron beam physical vapor deposition (EB-PVD)) which forms a columnar microstructure. Alternatively, suspension plasma spray may produce a columnar microstructure. In EB-PVD, the columns themselves are crystalline (crystalline growth through the column). In SPS, the sprayed particles may be crystalline but the column is not formed by crystalline growth/propagation.

In the exemplary embodiment, the first coating layer 110 is only along the recesses 104. Along the intact portions 106, only the second layer 112 extends. However, along both there is a bondcoat 114, 116 intervening between the substrate and the adjacent ceramic. In the exemplary implementation, the second layer 112 and bondcoat 116 extend along the surface 102 in the zone 80. FIG. 2A also shows segmentation cracks 120 extending through the second layer 112 at perimeters of the recesses 104.

The exemplary first coating layer 110 consists essentially of a gadolinia stabilized zirconia (GSZ). The GSZ may have advantages of limiting the infiltration of molten contaminants from the environment such as CMAS (calcium-magnesium-alumino-silicate). GSZ has lower thermal conductivity than YSZ, thus providing greater insulation. Also, GSZ has lower fracture toughness, allowing crack formation as discussed below.

The second coating layer 112 may consist essentially of EB-PVD GSZ with columnar structure which may have advantages of high resistance to erosion and spallation. The gadolinia in GSZ chemically reacts with molten CMAS to form a barrier layer of higher melting point products to limit further infiltration. The gadolinia concentration in typical GSZ coatings is much higher than the yttria concentration in typical YSZ coatings. Such levels of gadolinia are more reactive than such levels of yttria.

The first bondcoat 114 may consist essentially of an MCrAlY such as a CoNiCrAlYHfSi (e.g., PWA286 (see U.S. Pat. No. 5,599,385) deposited by LPPS, HVOF, or APS. HVOF offers ease of use (e.g., allowing sequential application of the bond coat and subsequent ceramic in the same chamber/booth and with the same gun. Durability of bond coat 114 may be further enhanced by diffusion heat treatment.

The second bondcoat 116 may consist essentially of an MCrAlY such as a CoNiCrAlYHfSi (e.g., PWA286) deposited by cathodic arc, electron beam physical vapor deposition (EB-PVD), LPPS, or HVOF. Durability of bond coat 116 may be further enhanced by diffusion heat treatment. In general, a rough finish bond coat is required for adherence of a powder sprayed (e.g., APS) ceramic. Such rough finish is provided by spray techniques such as LPPS or APS. HVOF is typically smoother than LPPS and APS. EB-PVD ceramics have better durability when applied to smooth bondcoats. EB-PVD provides a very smooth bondcoat. Cathodic arc is relatively smooth as-applied but may be further smoothed (e.g., surface treatment such as peening) prior to EB-PVC ceramic application. LPPS or HVOF may similarly be smoothed prior to application for EB-PVD ceramic. SPS ceramic may benefit from an intermediate roughness bond coat such as LPPS or cathodic arc which after surface treatment and grit blasting may be down to 50 to 150 Ra. HVOF offers ease of application. However the oxygen in the process may excessively increase TGO growth rate and thus speed failure.

Thus, one combination involves HVOF for the bondcoat 114 (because the lower temperature exposure (under the thicker ceramic layer combination) will make the ease of application outweigh the reduced performance) and LPPS for the bondcoat 116.

Exemplary first bondcoat thickness is 10 micrometers to 300 micrometers, more particularly, 25 micrometers to 100 micrometers. An exemplary second bondcoat is 25 micrometers to 200 micrometers, more particularly, 50 micrometers to 125 micrometers. Exemplary first coating layer 110 thickness is 250 micrometers to 1000 micrometers, more particularly, 300 micrometers to 750 micrometers. An exemplary second coating layer thickness is 25 micrometers to 500 micrometers, more particularly, 100 micrometers to 250 micrometers.

In an exemplary sequence of manufacture, the basic substrate is cast (such as via an investment casting process). The exemplary substrate material is a nickel-based superalloy. The substrate may be machined to leave the surface 102 and may be subject to one or more additional processing steps including but not limited to thermal processing (e.g., heat treatments) and mechanical processing (e.g., peening). In this first example of a manufacturing process, the bondcoat 116 is then applied across both the zones 80 and 82. As is discussed further below, the bondcoat 116 may extend along other zones of the airfoil and gaspath-facing surfaces of the platform and shroud.

After depositing the bondcoat 116 (or a precursor to the extent that subsequent diffusion, oxidation, or the like alters the composition and microstructure), the recesses 104 may then be formed (e.g., via machining such as laser drilling). Thus, the machining may locally remove the bondcoat 116 and then some substrate below. In one exemplary embodiment, prior to the machining, the surface of the bondcoat 116 is masked but the laser drilling locally cuts through the mask. An exemplary mask is a UV-cure mask.

An alternative may involve forming the casting with the recesses. The casting may still be machined or ground on the surface to help create the sharp corners of the recess cross-sections at their rims. Further, the base corners of the recess cross-sections may be machined to sharpen them. Thus, the bondcoat 116 may initially continue from the surface adjacent the recesses into the recesses. However, the subsequent machining may remove it from the recesses.

The exemplary laser machining is a multi-stage process wherein a first stage machines the gross features of the recesses and a second stage cleans and roughens the bases of the recesses. The first stage may be at a higher power offering low resolution and may leave recast slag. The cleaning may be at lower power and finer dimensional resolution and may remove some of this slag, sharpen the inner and outer radii of the cross-section (i.e., corners at the base and rim of the recesses), and be used to produce a textured surface for bond coat 114 to adhere to.

After laser machining, the bondcoat 114 may be applied such as via spray (e.g., air plasma spray (APS) or high velocity oxygen fuel (HVOF)). At least in the recesses, the bondcoat is 114 is particularly optional. This is because the lower surface temperature at the bottom of the recesses compared with the top of the ridges between recesses is less demanding of the bond coat to provide a protective thermally grown oxide (TGO). At the lower temperature, the substrate itself may be able to form a protective TGO in this location. This substrate-based TGO allows the layer 110 to directly bond with the substrate alloy and survive engine operation when sufficient surface roughness is present. This surface roughness may be provided by the recess machining operation, abrasive grit blast, laser ablation or other means. At a higher temperature, the substrate (absent bond coat) would be subject to excessive oxidation and thus encourage spalling.

After application of the bondcoat 114, the ceramic 110 may then be applied. This may be applied flush, slightly subflush, or slightly proud of the surface of the bondcoat 116. Particularly if proud, there may be a subsequent machining down of the coating 110 (e.g., to create a surface flush with the surface of the bondcoat 116). Then, the ceramic 112 may be applied. Segmentation cracks 120 will tend to form through the ceramic coating 112 along the perimeters of the recesses. These cracks function to accommodate differential thermal expansion of the substrate and/or first layer 110 on the one hand and the second layer 112 on the other hand. In a particular exemplary sequence, the ceramic 110 is applied proud. The article is then demasked (e.g., the mask is burned off (e.g., by heating to 900° F. (482° C.)) or chemically removed).

There may be a diffusion heat treat. This may be before or after the application of the ceramic 110 and/or 112. Exemplary diffusion heat treat is 1975° F. (1079° C.) for 4 hours in vacuum, inert or reducing atmosphere.

The proud material of the ceramic 100 may then be machined flush or otherwise blended with the adjacent bondcoat 116. Thereafter the coating 112 may be applied.

Several considerations attend the allocation of the different regions. A thick, highly insulating coating is generally desirable for thermal management purposes. It reduces the local air cooling load required which increases efficiency. However, a thicker, more insulative, coating will tend to be associated with higher coating surface temperatures. This may cause local sintering along the surface and reduces durability. Thus, the thicker coating may be disadvantageous for use in high erosion regions such as the leading edge zone 80.

The use of spraying the ceramic first layer 110 allows a rapid build-up of thickness. The ceramic first coating layer 110 may be deposited as molten or semi-molten droplets using APS (or potentially HVOF). When deposited as molten or semi-molten droplets that solidify upon deposition, a three dimensional compliance is produced (low modulus coating structure). This compliant microstructure results in the ability of coating layer 110 to dissipate the stresses associated with sintering shrinkage and differential thermal expansion between dissimilar material layers and with thermal gradient. Along with localization of crack formation, this ability to accommodate strain (dissipate stresses) may allow the recessed structure to provide benefits.

Regarding other zones of the airfoil in particular and vane generally, a number of considerations may attend selection of particular coating materials. For example, the zone 84 may feature either of the coating situations depending on thermal and aerodynamic loading.

Additionally, other high thermal loading areas are the OD surface 42 of the ID platform 36 and the ID surface of the OD shroud, both particularly adjacent the pressure side of the airfoil. Accordingly, the gaspath surfaces of platform and shroud or just that pressure side adjacent region may also fall within the recessed region with the multi-layer coating. The recesses may represent at least 20% of the area of the zone(s) having the recesses (e.g., 30%-70% or see geometric ranges associated with the array disclosed in U.S. Pat. No. 8,535,783). In the exemplary vane or a similar blade application, along the lateral surface (pressure side and suction side combined from leading edge to trailing edge) of the airfoil (e.g., excluding the tip of a blade) the recesses may represent at least 1% or at least 2% or at least 5% or at least 10% or at least 17% of the area with upper limits likely at 50% or 70% in expected applications. Similarly, the unrecessed areas bearing the EB-PVD coating may represent at least 1% or at least 2% or at least 5% or at least 10% or at least 30%, generally, or in expected applications at least 50% with upper limits complementary to the recessed area percentages specified above.

Figure 3:
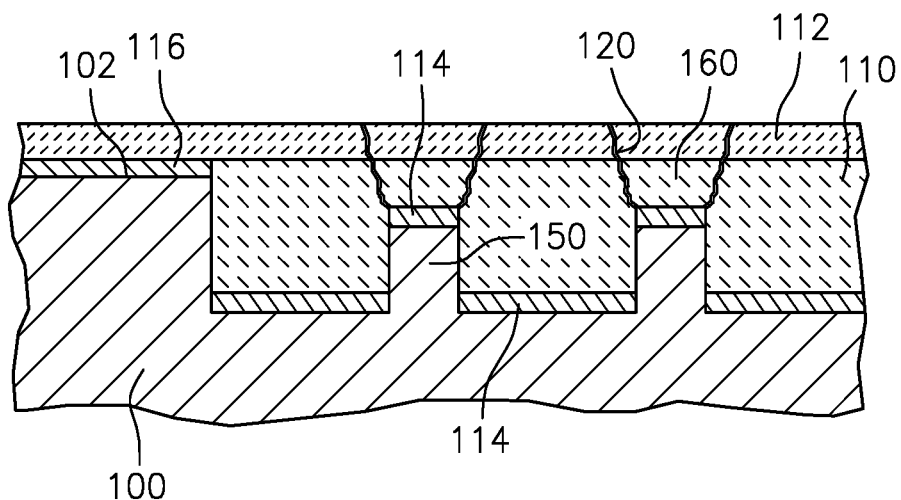
FIG. 3 is an enlarged view of an alternative coating on the airfoil of FIG. 2.

FIG. 3 shows an alternative implementation wherein the recesses are separated by partially recessed walls 150. Thus, whereas the exterior surface along the FIG. 2A intact portions 106 is essentially level with that away from the recessed zone or region, the exterior surface along the walls 150 is sub-flush to the surface 102 away from the recessed zone or region. This leaves a partial depth section 160 of the first coating layer 110 intervening between the walls 150 and the second coating layer 112. The segmentation cracks 120 thus propagate through both of the layers 110 and 112. In this exemplary embodiment, a further difference is that along the surfaces of the walls the bondcoat 114 is present instead of the bondcoat 116.

An exemplary method of manufacture for the FIG. 3 vane is otherwise similar to the method described for FIG. 2A.

The exemplary machining of the recesses also removes height along the walls 150. The laser cleaning/roughening may then also include the outer surfaces of the walls.

There are numerous further variations on the coating process. Some of these involve additional layers. One example of an additional layer is a high toughness ceramic interlayer applied atop the bondcoat 114. An exemplary interlayer material is 7YSZ deposited to a thickness well less than the thicknesses of the coatings 110 and 112 and potentially close to that of the bondcoats. For example, a 7YSZ plasma sprayed (or HVOF) coating 110 is applied to bond coat 114 with spray conditions that produce a dense and high toughness layer. For example, an Oerlikon Metco 3 MB torch is used to apply 25 to 75 micrometers of 7YSZ (Metco 204B-NS powder) using a #705 nozzle, 50 lpm (liters per minute) of nitrogen plus 6 lpm of hydrogen as plasma gasses, 42 kW, 75 millimeters torch to part distance and 625 millimeters per second relative traverse speed across the part surface. The part is heated using the spray torch to a temperature of between 500° C. and 900° C. prior to coating and maintained at that temperature during deposition of the interlayer.

In the interlayer example immediately above, the interlayer is only on the sprayed bond coat 114. Also or alternatively there may be another interlayer as part of the EB-PVD top layer 112. That could be a 7YSZ EB-PVD layer of 10 to 75 microns or more specifically 10 to 50 microns when a GSZ or other lower fracture toughness coating is used for the remainder of the layer 112.

Other variations involve the coating materials and application techniques. A YSZ such as 7YSZ may have higher fracture toughness than GSZ as the sprayed layer 110. This may provide higher spallation and erosion resistance at the expense of increasing thermal conductivity.

Yet other variations involve the shape and patterning of the recesses. In one variation on cross-sectional shape, the laser machining produces undercuts along the sidewalls of the recesses that have a shadow masking effect similar to that of U.S. Pat. No. 8,535,783.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing baseline article and/or process, details of such baseline may influence details of particular implementations. Accordingly, other embodiments are within the scope of the following claims.

What is claimed is:

1. An article comprising:
   a metallic substrate having a plurality of recesses along a first region, the substrate forming an airfoil having a leading edge, a trailing edge, a pressure side and a suction side, the plurality of recesses being on the pressure side;
   a first bondcoat along respective bases of the plurality of recesses;
   a first coating at least at the plurality of recesses and comprising:

a splatted ceramic layer; and
a columnar ceramic layer atop the splatted ceramic layer; and
a second coating along a second region away from the plurality of recesses and lacking recesses including the plurality of recesses, the second coating comprising:
a columnar ceramic layer atop a second bondcoat atop the substrate without a splatted ceramic layer intervening between the second bondcoat and the columnar ceramic layer.

2. The article of claim 1 wherein:
the second coating is between the recesses of the plurality of recesses.

3. The article of claim 1 wherein:
the first coating and the first bondcoat are also between the recesses of the plurality of recesses.

4. An article comprising:
a metallic substrate having a surface with a first region and a second region;
a plurality of recesses in the first region, the second region lacking recesses including the plurality of recesses;
a first coating system at least at the plurality of recesses in the first region and comprising:
a splatted ceramic layer; and
a columnar ceramic layer atop the splatted ceramic layer; and
a second coating system along the second region comprising:
a columnar ceramic layer atop the substrate without a splatted ceramic layer intervening between the substrate and the columnar ceramic layer.

5. The article of claim 4 wherein:
the first coating system columnar ceramic layer is a columnar crystalline layer; and
the second coating system columnar ceramic layer is a columnar crystalline layer.

6. The article of claim 4 wherein:
the substrate forms an airfoil having a leading edge, a trailing edge, a pressure side and a suction side; and
the second region is along the leading edge.

7. The article of claim 4 wherein:
the substrate forms an airfoil having a leading edge, a trailing edge, a pressure side and a suction side;
the first region is a majority of the pressure side; and
the second region is a majority of the suction side.

8. The article of claim 4 wherein:
the plurality of recesses are separated by walls; and
segmentation cracks extend from the walls through the first coating system columnar ceramic layer and/or the second coating system columnar ceramic layer.

9. The article of claim 8 wherein:
the segmentation cracks extend through the first coating system splatted ceramic layer.

10. The article of claim 4 wherein:
the plurality of recesses are separated by walls;
the second coating system extends along the walls; and
segmentation cracks extend from the walls through the first coating system columnar ceramic layer and/or the second coating system columnar ceramic layer.

11. The article of claim 4 wherein:
a first bondcoat is along respective bases of the plurality of recesses; and
a second bondcoat is along the second region.

12. The article of claim 11 wherein:
the first bondcoat is an MCrAlY; and
the second bondcoat is an MCrAlY.

13. The article of claim 4 wherein at least one of:
the metallic substrate is a nickel-based superalloy casting;
the first coating system splatted ceramic layer has a thickness of at least 250 micrometers;
the first coating system columnar ceramic layer has a thickness of at least 25 micrometers; and
the second coating system columnar ceramic layer has a thickness of at least 25 micrometers.

14. The article of claim 4 wherein at least one of:
the metallic substrate is a nickel-based superalloy casting;
the first coating system splatted ceramic layer has a majority by weight of GSZ over a thickness of at least 250 micrometers;
the first coating system columnar ceramic layer has a majority by weight of YSZ over a thickness of at least 25 micrometers; and
the second coating system columnar ceramic layer has a majority by weight of YSZ over a thickness of at least 25 micrometers.

15. The article of claim 4 wherein:
the first coating system columnar ceramic layer and the second coating system columnar ceramic layer are the same material.

16. The article of claim 4 wherein:
the first coating system columnar ceramic layer and the second coating system columnar ceramic layer are GSZ; and
the first coating system splatted ceramic layer is a YSZ.

17. The article of claim 4 having an airfoil, the airfoil having a leading edge, a trailing edge, a pressure side, and a suction side wherein:
the plurality of recesses represent at least 1% of a lateral surface area of the airfoil;
the first coating system is at least along 1% of the lateral surface area;
the second coating system is at least along 1% of the lateral surface.

18. A turbomachine including the article of claim 4 as an airfoil member.

19. The turbomachine of claim 18 being a gas turbine engine.

20. A method for manufacturing the article of claim 4, the method comprising:
applying a first bondcoat to at least the plurality of recesses via high velocity oxy-fuel spray; and
applying a second bondcoat to at least the second region via vapor deposition, plasma-spray, or cathodic arc deposition;
applying the first coating system splatted ceramic layer by air plasma spray; and
applying the first coating system columnar ceramic layer and the second coating system columnar ceramic layer via electron beam physical vapor deposition or suspension plasma spray.

21. An article comprising:
a metallic substrate having a plurality of recesses along a first region, the substrate forming an airfoil having a leading edge, a trailing edge, a pressure side and a suction side, the plurality of recesses being on the pressure side;
a first bondcoat along respective bases of the plurality of recesses;
a first coating at least at the plurality of recesses and comprising:
a splatted ceramic layer; and
a columnar ceramic layer atop the splatted ceramic layer; and a second coating along a second region away from the plurality of recesses and comprising:

a columnar ceramic layer atop a second bondcoat atop the substrate without a splatted ceramic layer intervening between the second bondcoat and the columnar ceramic layer, wherein all recesses, including the plurality of recesses, are only on the pressure side; and the second coating is on the pressure side and the suction side.

* * * * *